(12) United States Patent
DeRosa et al.

(10) Patent No.: US 9,723,719 B2
(45) Date of Patent: Aug. 1, 2017

(54) FLEXIBLE INTERCONNECT STRUCTURE FOR A SENSOR ASSEMBLY

(71) Applicant: KULITE SEMICONDUCTOR PRODUCTS, INC., Leonia, NJ (US)

(72) Inventors: Louis DeRosa, Wayne, NJ (US); Robert Gardner, Westwood, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

(21) Appl. No.: 15/263,587

(22) Filed: Sep. 13, 2016

(65) Prior Publication Data

US 2016/0381804 A1 Dec. 29, 2016

Related U.S. Application Data

(63) Continuation of application No. 14/989,332, filed on Jan. 6, 2016, now Pat. No. 9,518,887, which is a continuation of application No. 13/834,764, filed on Mar. 15, 2013, now Pat. No. 9,265,142.

(51) Int. Cl.
| | |
|---|---|
| *H05K 1/00* | (2006.01) |
| *H05K 1/18* | (2006.01) |
| *H05K 1/02* | (2006.01) |
| *H05K 1/11* | (2006.01) |
| *G01L 15/00* | (2006.01) |
| *G01L 19/14* | (2006.01) |
| *H05K 7/00* | (2006.01) |
| *H05K 1/03* | (2006.01) |

(52) U.S. Cl.
CPC .............. *H05K 1/189* (2013.01); *G01L 15/00* (2013.01); *G01L 19/14* (2013.01); *H05K 1/028* (2013.01); *H05K 1/115* (2013.01); *H05K 1/118* (2013.01); *H05K 1/0393* (2013.01); *H05K 2201/1028* (2013.01); *H05K 2201/10151* (2013.01); *H05K 2201/10287* (2013.01); *H05K 2201/2009* (2013.01)

(58) Field of Classification Search
CPC . H05K 2201/1028; H05K 2201/10287; H05K 1/0393; H05K 1/189; H05K 1/118
USPC ....... 361/748, 749, 750, 751, 760, 761, 762, 361/764, 765, 776, 783; 174/521, 251, 174/254, 255, 256
See application file for complete search history.

(56) References Cited

U.S. PATENT DOCUMENTS

| | | | | |
|---|---|---|---|---|
| 5,362,243 | A * | 11/1994 | Huss | H01R 13/719 361/749 |
| 2008/0127752 | A1* | 6/2008 | Nakano | B60N 2/002 73/862.627 |
| 2013/0162543 | A1* | 6/2013 | Behles | H01L 41/0475 345/173 |

\* cited by examiner

*Primary Examiner* — Binh Tran
(74) *Attorney, Agent, or Firm* — Troutman Sanders LLP; James E. Schutz; Mark Lehi Jones

(57) ABSTRACT

This disclosure provides example methods, devices, and systems for a flexible interconnect structure for a sensor assembly. In one configuration, a flexible interconnect structure may couple a first portion of a differential sensor structure to a second portion of the differential sensor structure. Further, the flexible interconnect structure may couple the differential sensor structure to an external component such as a circuit board, used to receive measurement information from the differential sensor.

9 Claims, 5 Drawing Sheets

FLEXIBLE INTERCONNECT STRUCTURE FOR A SENSOR ASSEMBLY

CROSS REFERENCE TO RELATED APPLICATIONS

This application is a Continuation of U.S. patent application Ser. No. 14/989,332, filed 6 Jan. 2016, entitled "Flexible Interconnect Structure for a Sensor Assembly," and published as U.S. Patent Application Publication No. US20160116358 on 28 Apr. 2016. U.S. patent application Ser. No. 14/989,332 is a Continuation of U.S. patent application Ser. No. 13/834,764, filed 15 Mar. 2013, entitled "Flexible Interconnect Structure for a Sensor Assembly," published as U.S. Patent Application Publication No. US20140268593 on 18 Sep. 2014, and issued as U.S. Pat. No. 9,265,142 on 16 Feb. 2016, the contents of which are hereby incorporated by reference in their entirety.

TECHNICAL FIELD

This disclosure generally relates to an interconnect, and more particularly to a flexible interconnect structure for a sensor assembly.

BACKGROUND

A sensor assembly may include two pressure sensors with each pressure sensor forming, for instance, one-half of a Wheatstone bridge. In this configuration, the two pressure sensors may be used to measure differential pressures. Alternatively, the two pressure sensors may be used to measure independent pressures or to redundantly measure the same pressure. Further, each of the two pressure sensors may be used in separate housings. Each of the two pressure sensors may have a header, which may be used to operatively interconnect the sensor to other devices by, for instance, soldering wires to the pins of the header. However, such interconnections may negatively impact the cost, quality, performance, or size of the corresponding device due to, for instance, the labor-intensive assembly of hand-wiring wires to headers and associated failure rates under high vibration, Accordingly, there is a need for improved methods, devices, and systems for interconnecting a sensor assembly.

SUMMARY OF THE DISCLOSURE

The subject technology relates to methods, devices, and systems fora flexible interconnect structure for a sensor assembly. In one embodiment, a flexible interconnect structure may be configured to include a first flexible section having a frontend and a backend. The flexible interconnect structure may be configured to include a first rigid section having a first connection point and a second connection point. The frontend of the first flexible section may be coupled to the first rigid section. Further, the first rigid section may be configured to couple to a first sensor structure via the first and second connection points. The flexible interconnect structure may be configured to include a second flexible section having a frontend and a backend. The second rigid section may have a third connection point and a fourth connection point. The second rigid section may be coupled to the backend of the first flexible section and the frontend of the second flexible section. The second rigid section may be configured to couple to a second sensor structure via the third and fourth connection points. The flexible interconnect structure may be configured to include a third rigid section having a fifth connection point, a sixth connection point and a seventh connection point. The third rigid section may be coupled to the backend of the second flexible section. The third rigid section may be configured to couple to a component via the fifth, sixth and seventh connection points. Also, the component may be configured to receive measurements from the first sensor structure and the second sensor structure. The first connection point may be coupled to the third connection point. Further, the second connection point may be coupled to the sixth connection point. Also, the third connection point may be coupled to the fifth connection point. Finally, the fourth connection point may be coupled to the seventh connection point.

BRIEF DESCRIPTION OF THE FIGURES

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where.

DETAILED DESCRIPTION

The following detailed description is merely illustrative in nature and is not intended to limit the present disclosure, or the application and uses of the present disclosure. Furthermore, there is no intention to be bound by any expressed or implied theory presented in the preceding field of use, background, or summary of the disclosure or the following detailed description. The present disclosure provides various examples, embodiments and the like, which may be described herein in terms of functional or logical block elements. Various techniques described herein may be used for a flexible interconnect structure for a sensor assembly. The various aspects described herein are presented as methods, devices (or apparatus), and systems that may include a number of components, elements, members, modules, nodes, peripherals, or the like. Further, these methods, devices, and systems may include or not include additional components, elements, members, modules, nodes, peripherals, or the like.

Throughout the specification and the claims, the following terms take at least the meanings explicitly associated herein, unless the context clearly dictates otherwise. The terms "connect," "connecting," and "connected" mean that one function, feature, structure, or characteristic is directly joined to or in communication with another function, feature, structure, or characteristic. The terms "couple," "coupling," and "coupled" mean that one function, feature, structure, or characteristic is directly or indirectly joined to or in communication with another function, feature, structure, or characteristic. Relational terms such as "first" and "second," and the like may be used solely to distinguish one entity or action from another entity or action without necessarily requiring or implying any actual such relationship or order between such entities or actions. The term "or" is intended to mean an inclusive "or." Further, the terms "a," "an," and "the" are intended to mean one or more unless specified otherwise or clear from the context to be directed to a singular form. The term "include" and its various forms are intended to mean including but not limited to.

In the following description, numerous specific details are set forth. However, it is to be understood that embodiments of the disclosed technology may be practiced without these specific details, References to "one embodiment," "an embodiment," "example embodiment," "various embodiments," and other like terms indicate that the embodiments of the disclosed technology so described may include a particular function, feature, structure, or characteristic, but not every embodiment necessarily includes the particular function, feature, structure, or characteristic. Further, repeated use of the phrase "in one embodiment" does not necessarily refer to the same embodiment, although it may.

Figure 1:
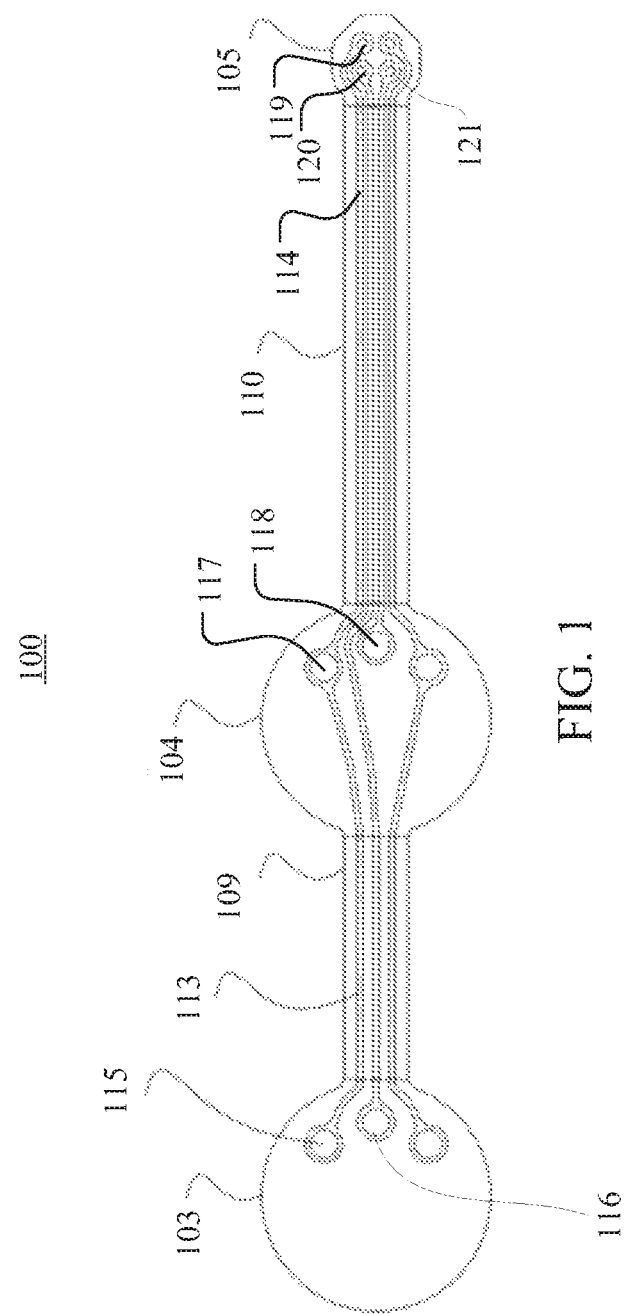
FIG. 1 illustrates a top view of one embodiment of a flexible interconnect structure for a differential sensor in accordance with various aspects set forth herein.

This disclosure provides example methods, devices, and systems for a flexible interconnect structure for a sensor assembly. In one configuration, as shown in FIG. 1, a flexible interconnect structure may couple a first portion of a differential sensor structure to a second portion of the differential sensor structure. Further, the flexible interconnect structure may couple the differential sensor structure to an external component such as a circuit board, used to receive measurement information from the differential sensor. FIG. 1 illustrates a top view of one embodiment of a flexible interconnect structure 100 for a differential sensor in accordance with various aspects set forth herein. In one example, the flexible interconnect structure 100 may be used for a differential sensor. The flexible interconnect structure 100 may be configured to include first, second and third rigid sections 103, 104 and 105 and a first and second flexible sections 109 and 110, respectively. Each of the first and second flexible sections 109 and 110 may have a frontend and a backend. The frontend of the first flexible section 109 may be coupled to the first rigid section 103 and the backend of the first flexible section 109 may be coupled to the second rigid section 104. Similarly, the frontend of the second flexible section 110 may be coupled to the second rigid section 104 and the backend of the second flexible section 110 may be coupled to the third rigid section 105.

In FIG. 1, the first rigid section 103 may be configured to include first and second connection points 115 and 116, respectively. The first and second connection points 115 and 116 may be used to couple the first rigid section 103 to a component such as a sensor structure or a circuit board. The second rigid section 104 may be configured to include third and fourth connection points 117 and 118, respectively. The third and fourth connection points 117 and 118 may be used to couple the second rigid section 104 to a component such as a sensor structure or a circuit board. The third rigid section 105 may be configured to include fifth, sixth and seventh connection points 119, 120 and 121, respectively.

The fifth, sixth and seventh connection points 119, 120 and 121 may be used to couple the third rigid section 105 to a component such as a sensor structure or a circuit board. Each of the connection points 115 to 121 may be plated such as with copper or may be a through hole. A contact or lead of a component may be soldered onto or into one or more of the connection points 115 to 121. Further, one or more of the connection points may be attached to a contact or lead of a component via a spring-loaded or crimp contact soldered onto or into one or more of the connection points.

In this embodiment, each of the flexible sections 109 and 110 may include one or more traces 113 and 114, respectively. Each of the traces 113 and 114 may be used to couple two or more connection points 115 to 121. For example, a trace of the first flexible section 109 may couple the first connection point 115 of the first rigid section 103 to the third connection point 117 of the second rigid section 104. In another example, a trace of the second flexible section 110 may couple the third connection point 117 of the second rigid section 104 to the fifth connection point 119 of the third rigid section 105. In another example, a trace of the first flexible section 109 and a trace of the second flexible section 110 may couple the second connection point 116 of the first rigid section 103 to the sixth connection point 120 of the third rigid section 105. In another example, a trace of the second flexible section 110 may couple the fourth connection point 118 of the second rigid section 104 to the seventh connection point 121 of the third rigid section 105, Each of the traces 113 and 114 may be a metal such as copper.

In FIG. 1, in operation, for example, one or more of the connection points 115 and 116 of the first rigid section 103 may be coupled to a connector such as a header pin, a contact or a lead of a first portion of a differential sensor structure. Further, one or more of the connection points 117 and 118 of the second rigid section 104 may be coupled to a connector of a second portion of the differential sensor structure. Also, one or more of the connection points 119, 120 and 121 of the third rigid section 105 may be coupled to a connector of a component such as a circuit board, used to receive measurements from the differential sensor structure.

Figure 2:
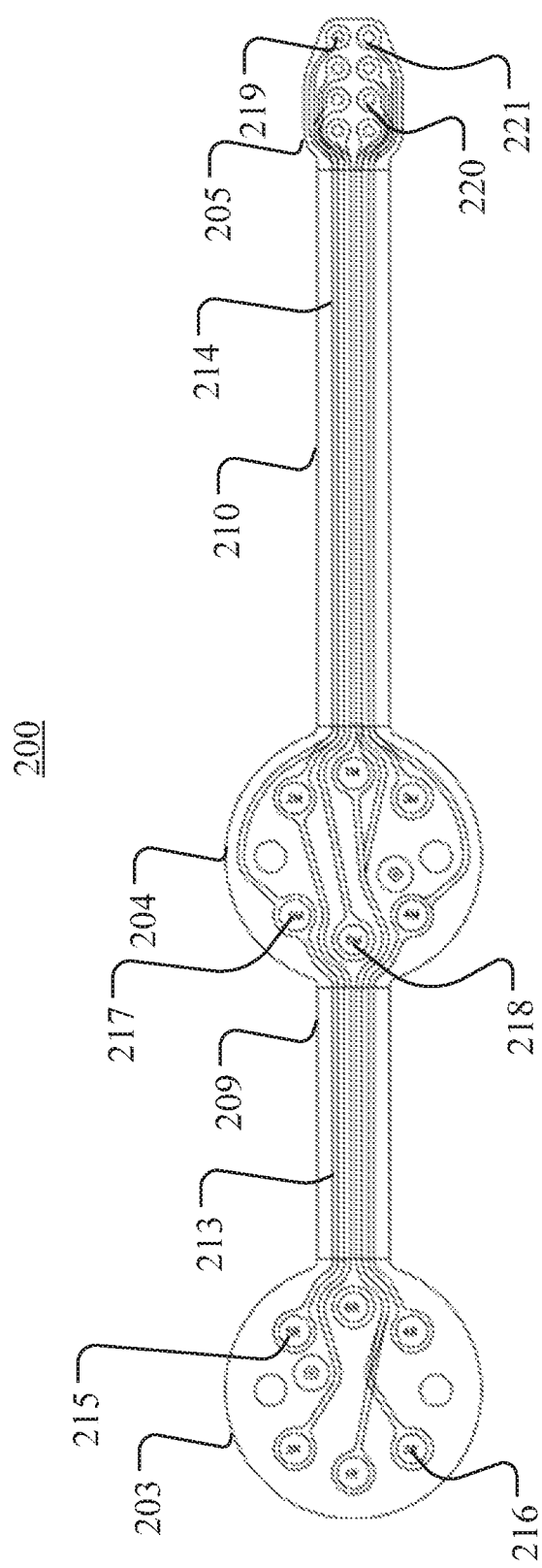
FIG. 2 illustrates a top view of one embodiment of a flexible interconnect structure for redundant sensors in accordance with various aspects set forth herein.

In another configuration, as shown in FIG. 2, a flexible interconnect structure may be configured to support two redundant sensors rather than a differential sensor. For example, the flexible interconnect structure may couple a first sensor structure and a second sensor structure to a component such as used to receive measurement information from the first and second sensor structures. FIG. 2 illustrates a top view of one embodiment of a flexible interconnect structure 200 for redundant sensors in accordance with various aspects set forth herein. The flexible interconnect structure 200 may be configured to include first, second and third rigid sections 203, 204 and 205 and a first and second flexible sections 209 and 210, respectively. Each of the first and second flexible sections 209 and 210 may have a frontend and a backend. The frontend of the first flexible section 209 may be coupled to the first rigid section 203 and the backend of the first flexible section 209 may be coupled to the second rigid section 204. Similarly, the frontend of the second flexible section 210 may be coupled to the second rigid section 204 and the backend of the second flexible section 210 may be coupled to the third rigid section 205.

In FIG. 2, the first rigid section 203 may be configured to include first and second connection points 215 and 216, respectively. The first and second connection points 215 and 216 may be used to couple the first rigid section 203 to a component such as a sensor structure or a circuit board. The second rigid section 204 may be configured to include third and fourth connection points 217 and 218, respectively. The third and fourth connection points 217 and 218 may be used to couple the second rigid section 204 to a component such as a sensor structure or a circuit board. The third rigid section 205 may be configured to include fifth, sixth and seventh connection points 219, 220 and 221, respectively. The fifth, sixth and seventh connection points 219, 220 and 221 may be used to couple the third rigid section 205 to a component such as a sensor structure or a circuit board.

In this embodiment, each of the flexible sections 209 and 210 may include one or more traces 213 and 214, respectively. Each of the traces 213 and 214 may be used to couple two or more connection points 215 to 221. For example, a trace of the first flexible section 209 may couple the first connection point 215 of the first rigid section 203 to the third connection point 217 of the second rigid section 204. In another example, a trace of the second flexible section 210 may couple the third connection point 217 of the second rigid section 204 to the fifth connection point 219 of the third rigid section 205. In another example, a trace of the first flexible section 209 and a trace of the second flexible section 210 may couple the second connection point 216 of the first rigid section 203 to the sixth connection point 220 of the third rigid section 205. In another example, a trace of the second flexible section 210 may couple the fourth connection point 218 of the second rigid section 204 to the seventh connection point 221 of the third rigid section 205. Each of the traces 213 and 214 may be a metal such as copper.

In FIG. 2, in operation, for example, the first rigid section 203 may be coupled to a connector such as a header pin, a contact or a lead of a first sensor structure via the connection points of the first rigid section 203. Further, the second rigid section 204 may be coupled to a connector of a second sensor structure via the connection points of the first rigid section 204. Also, the third rigid section 205 may be coupled to a connector of a component such as a circuit board, which may be used to receive measurements from or control the first and second sensor structures. Such configuration may allow for the use of redundant sensors or differential sensors.

Figure 3:
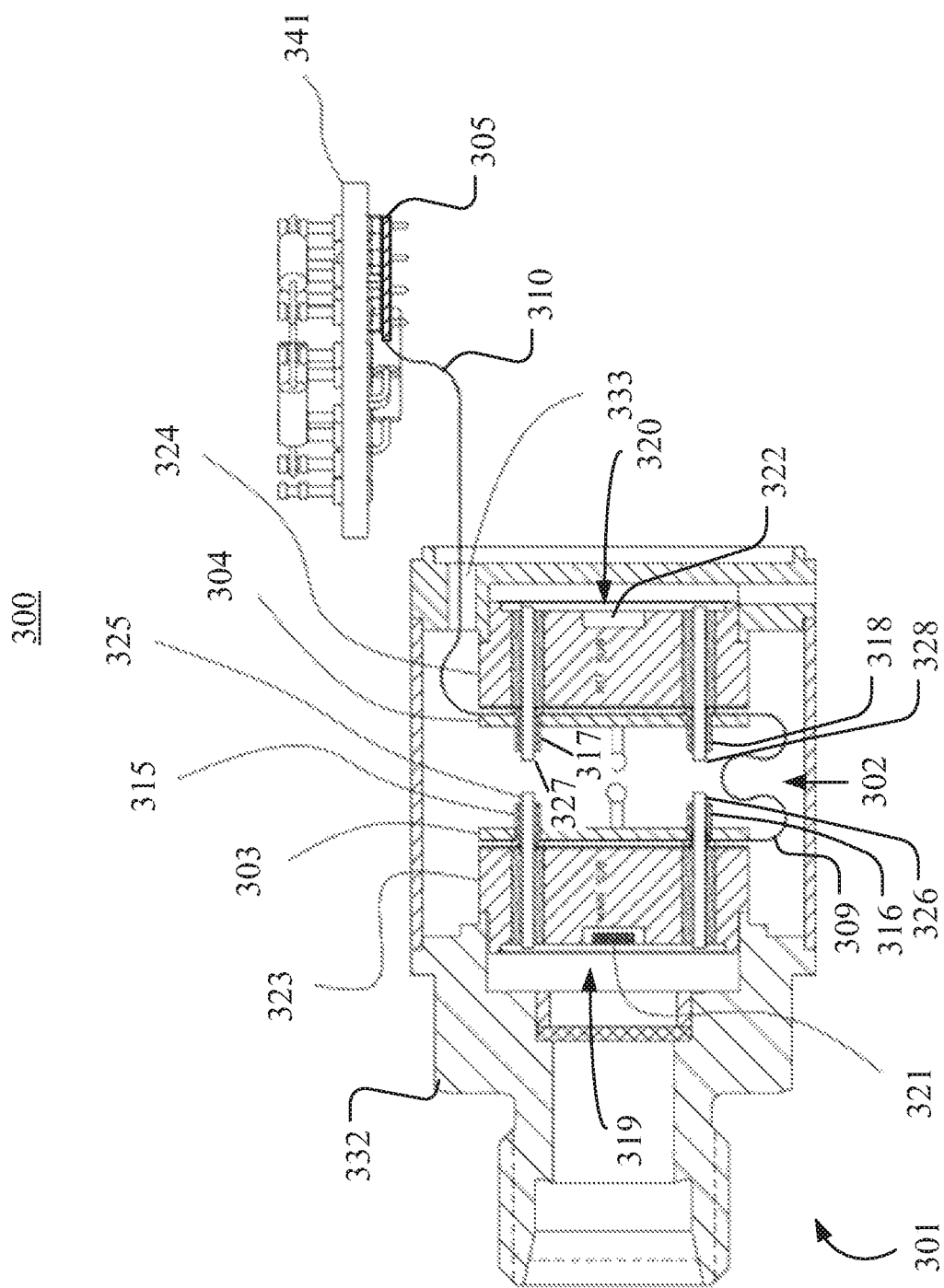
FIG. 3 illustrates one embodiment of a system having a flexible interconnect structure for a sensor assembly in accordance with various aspects set forth herein.

FIG. 3 illustrates one embodiment of a system 300 having a flexible interconnect structure 302 fora sensor assembly 301 in accordance with various aspects set forth herein. The system 300 may be configured to include the sensor assembly 301, the flexible interconnect structure 302, and a component 341. The sensor assembly 301 and a portion of the flexible interconnect structure 302 associated with the sensor assembly 301 are illustrated in FIG. 3 as a partial longitudinal cross-sectional view. The component 341 and a portion of the flexible interconnect structure 302 associated with the component 341 are illustrated in FIG. 3 as a side view.

In FIG. 3, the sensor assembly 301 may be configured to include a first sensor structure 319, a second sensor structure 320, a front port 332 and a reference port 333. In one example, each of the first and second sensor structures 319 and 320 may be configured to measure pressures of a fluid. In another example, the first and second sensor structure 319 and 320 may be configured to form a differential pressure sensor or redundant sensors. In another example, the first sensor structure 319 may form a first half of a Wheatstone bridge and the second sensor structure 320 may form a second half of the Wheatstone bridge. The first sensor structure 319 may be configured to include a first sensor element 321, a first header 323 and first and second header pins 325 and 326. Similarly, the second sensor structure 320 may be configured to include a second sensor element 322, a second header 324 and third and fourth header pins 327 and 328. Each of the first and second sensor elements 321 and 322 may be configured collectively or individually as a pressure sensor. Each of the first and second headers 323 and 324 may include a header shell that defines a sensor cavity. In one example, the header shell may be metal. Further, the sensor cavities of each of the first and second headers 323 and 324 may house the first and second sensor elements 321 and, respectively. The first and second header pins 325 and 326 may be electrically coupled to the first sensor element 321. Further, the third and fourth header pins 327 and 328 may be electrically coupled to the second sensor element 322. It is important to note that a person of ordinary skill in the art will recognize the various structures, configurations and uses of sensors.

In FIG. 3, the flexible interconnect structure 302 may be configured to include first, second and third rigid sections 303, 304 and 305 and a first and second flexible sections 309 and 130, respectively. Each of the first and second flexible sections 309 and 310 may have a frontend and a backend. The frontend of the first flexible section 309 may be coupled to the first rigid section 303 and the backend of the first flexible section 309 may be coupled to the second rigid section 304. Similarly, the frontend of the second flexible section 310 may be coupled to the second rigid section 304 and the backend of the second flexible section 310 may be coupled to the third rigid section 305. The flexible interconnect structure 302 may be bent around the inside of the sensor assembly 301 such that the first rigid section 303 is directly behind the first header 323. Similarly, the flexible interconnect structure 303 may be bent around the inside of the sensor assembly 301 such that the second rigid section 304 is directly behind the second header 324.

In this embodiment, the first rigid section 303 may be configured to include first and second connection points 315 and 316, respectively. The first and second connection points 315 and 316 may be used to couple the first rigid section 303 to the first sensor structure 319. For example, the first rigid section 303 may be pressed onto the back of the first header 323 such that the first and second header pins 325 and 326 pass through the first and second connection points 315 and 316 to couple to the first sensor structure 319. The second rigid section 304 may be configured to include third and fourth connection points 317 and 318, respectively. The third and fourth connection points 317 and 318 may be used to couple the second rigid section 304 to the second sensor structure 320. For example, the second rigid section 304 may be pressed onto the back of the second header 324 such that the third and fourth header pins 327 and 328 pass through the third and fourth connection points 317 and 318, respectively, to couple to the second sensor structure 320. The third and fourth connection points 317 and 318 may be used to couple the second rigid section 304 to a component such as a circuit board. The third rigid section 305 may be configured to include one or more connection points. The one or more connection points of the third rigid section 305 may be used to couple the third rigid section 305 to a component such as a sensor structure or a circuit board.

In FIG. 3, each of the flexible sections 309 and 310 may include one or more traces. The one or more traces may be used to couple two or more connection points. For example, a trace of the first flexible section 309 may couple the first connection point 315 of the first rigid section 303 to the third connection point 317 of the second rigid section 304. In another example, a trace of the second flexible section 310 may couple the third connection point 317 of the second rigid section 304 to a connection point of the third rigid section 305. In another example, a trace of the first flexible section 309 and a trace of the second flexible section 130 may couple the second connection point 316 of the first rigid section 303 to a connection point of the third rigid section 305. In another example, a trace of the second flexible section 130 may couple the fourth connection point 318 of the second rigid section 304 to a connection point of the third rigid section 305. Each of the traces may be a metal such as copper.

In this embodiment, one or more of the connection points 315 and 316 of the first rigid section 303 may be coupled to the first sensor structure 319 via the header pins 325 and 326 to form, for instance, a first portion of a differential sensor structure, a first half of a Wheatstone bridge, a first redundant sensor, or other similar structure. In one example, the first rigid section 303 may be pressed onto the back of the first header 323 such that the first and second header pins 325 and 326 pass through the first and second connection points 315 and 316, respectively, using spring-loaded connection points to couple to the first sensor structure 319. In another example, the first and second connection points 315 and 316 may be crimped or soldered to the first rigid section 303 to allow for a more rugged contact. In either case, such connection schemes are quicker, easier, or more reliable than soldering individual wires to each header pin. The first flexible section 309 may pass through or around any small sections or openings of the sensor assembly 301 to allow the second rigid section 304 to be, for instance, soldered or pressed onto the second sensor structure 320. The third and fourth connection points 317 and 318 of the second rigid section 304 may be coupled to the third and fourth header pins 327 and 328 of the second sensor structure 320, respectively, to form, for instance, a second portion of a differential sensor structure, a second half of a Wheatstone bridge, a second redundant sensor, or other similar structure. The second flexible section 310 may pass through or around any small sections or openings of the sensor assembly 301 such as the second opening 335 and may be, for instance, soldered or pressed onto the component 341, which may receive pressure measurements from the sensor assembly 301, perform temperature compensation of such pressure measurements, or other similar functions for measuring pressure.

A person of ordinary skill in the art will recognize that another advantage of the flexible interconnect structure 302 applied to the sensor assembly 301 is that it allows for coupling, for instance, two halves of a Wheatstone bridge using the flexible interconnect structure 302 rather than using the component 341 to couple all of the connections. Thus, such configuration may allow for fewer connections from the sensor assembly 301 to the component 341. For example, a typical sensor configuration for the sensor assembly 301 may require six connections between the first and second headers 323 and 324 of the sensor assembly 301, respectively, and a header of the component 341. By using the flexible interconnect structure 302, only four connections may be required between the first and second headers 323 and 324 of the sensor assembly 301, respectively, and a header of the component 341.

Figure 4:
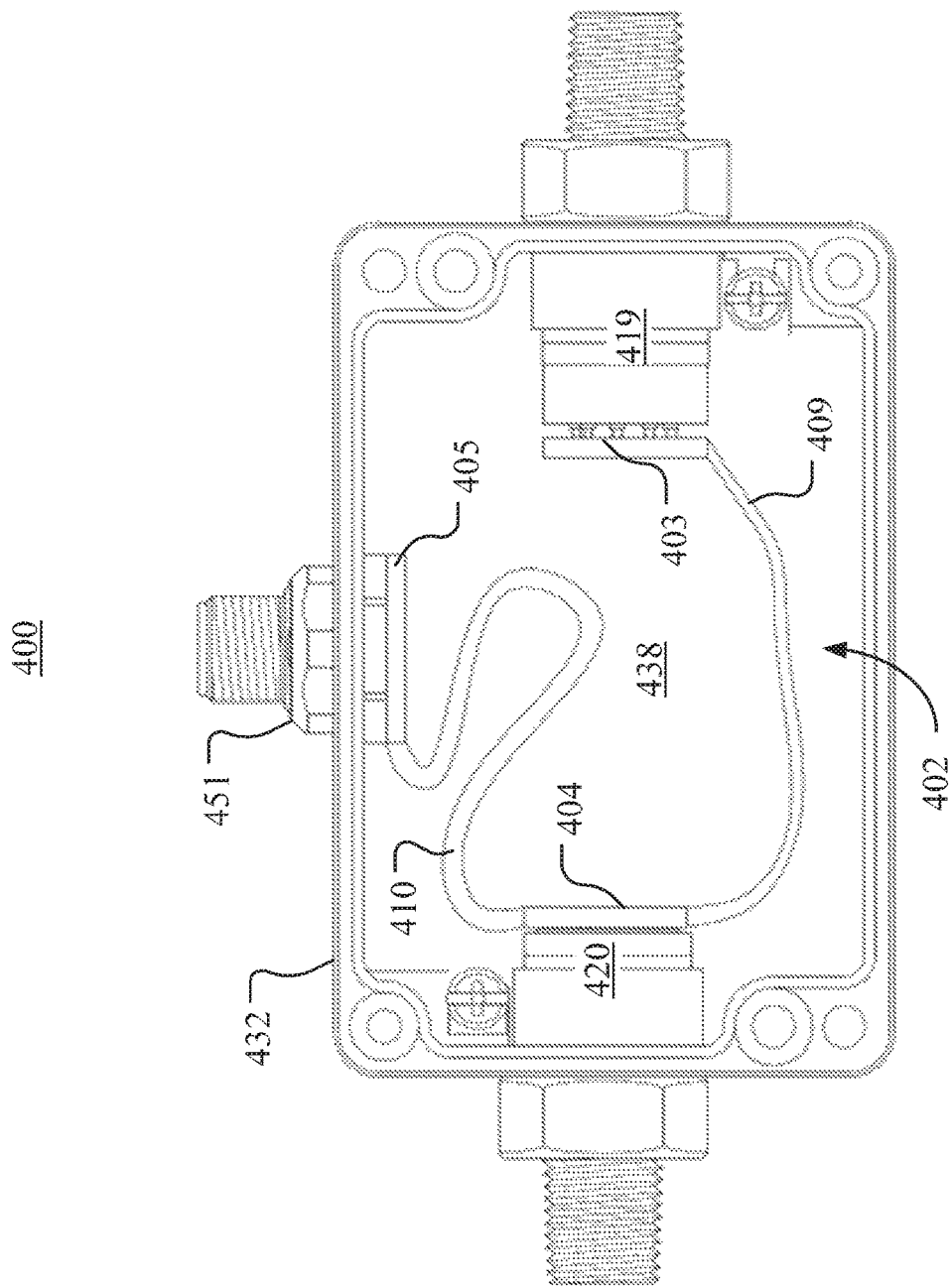
FIG. 4 illustrates a partial longitudinal cross-sectional view of another embodiment. of a sensor assembly having a flexible interconnect structure in accordance with various aspects set forth herein.

The flexible interconnect structure may be used for different sensor configurations and, in some instances, without changing the configuration of the flexible interconnect structure. For example, FIG. 4 illustrates a partial longitudinal cross-sectional view of another embodiment of a sensor assembly 400 having a flexible interconnect structure 402 in accordance with various aspects set forth herein. In FIG. 4, the sensor assembly 400 may be configured to include first and second sensor structures 419 and 420 contained in a cavity of a housing 432 and interfacing to an external component via a connector 451. In one example, each of the first and second sensor structures 419 and 420 may be configured to measure pressures of a fluid. In another example, the first and second sensor structure 419 and 420 may be configured to form a differential pressure sensor or redundant sensors. In another example, the sensor element of the first sensor structure 419 may form a first half of a Wheatstone bridge and the sensor element of the second sensor structure 420 may form a second half of the Wheatstone bridge. Each of the first and second sensor structures 419 and 420 may be configured to include a sensor element, a header and one or more header pins. Each of the headers of the first and second sensor structures 419 and 420 may include a header shell that defines a sensor cavity. In one example, the header shell may be metal. Further, each sensor cavity of the first and second sensor structures 419 and 420 may house one or more sensor elements. The header pins of each of the first and second sensor structures 419 and 420 may be electrically coupled to its sensor element.

In FIG. 4, the flexible interconnect structure 402 may be configured to include first, second and third rigid sections 403, 404 and 405 and first and second flexible sections 409 and 410, respectively. Each of the first and second flexible sections 409 and 410 may have a frontend and a backend. The frontend of the first flexible section 409 may be coupled to the first rigid section 403 and the backend of the first flexible section 409 may be coupled to the second rigid section 404. Similarly, the frontend of the second flexible section 410 may be coupled to the second rigid section 404 and the backend of the second flexible section 410 may be coupled to the third rigid section 405. The flexible interconnect structure 402 may bend within the cavity 438 of the sensor assembly 400 such that the first rigid section 403 is directly behind the header of the first sensor structure 419. Similarly, the flexible interconnect structure 403 may bend within the cavity 438 of the sensor assembly 401 such that the second rigid section 404 is directly behind the header of the second sensor structure 420.

In this embodiment, the first rigid section 403 may be configured to include one or more connection points. The one or more connection points of the first rigid section 403 may be used to couple the first rigid section 403 to the first sensor structure 419. The first rigid section 403 may be pressed onto the back of a header of the first sensor structure 419 such that the one or more header pins of the first sensor structure 419 pass through the one or more connection points of the first rigid section 403 to couple to the first sensor structure 419. The second rigid section 404 may be configured to include one or more connection points. The one or more connection points of the second rigid section 404 may be used to couple the second rigid section 404 to the second sensor structure 420. The second rigid section 404 may be pressed onto the back of a header of the second sensor structure 420 such that the one or more header pins of the second sensor structure 420 pass through the connection points of the second rigid section 404 to couple to the second sensor structure 420. The third rigid section 405 may be configured to include one or more connection points. The one or more connection points of the third rigid section 405 may be used to couple the third rigid section 405 to an external component via the connector 451, which may be used to couple the sensor assembly 400 to an external component such as a circuit board used to control or acquire measurements from the sensor assembly 400.

In FIG. 4, each of the flexible sections 409 and 410 may include one or more traces. The one or more traces may be used to couple connection points between rigid sections 403, 404 and 405. For example, a trace of the first flexible section 409 may couple a connection point of the first rigid section 403 to a connection point of the second rigid section 404. In another example, a trace of the second flexible section 410 may couple a connection point of the second rigid section 404 to a connection point of the third rigid section 405. In another example, a trace of the first flexible section 409 and a trace of the second flexible section 130 may couple a connection point of the first rigid section 403 to a connection point of the third rigid section 405. In another example, a trace of the second flexible section 410 may couple a connection point of the second rigid section 404 to a connection point of the third rigid section 405.

Figure 5:
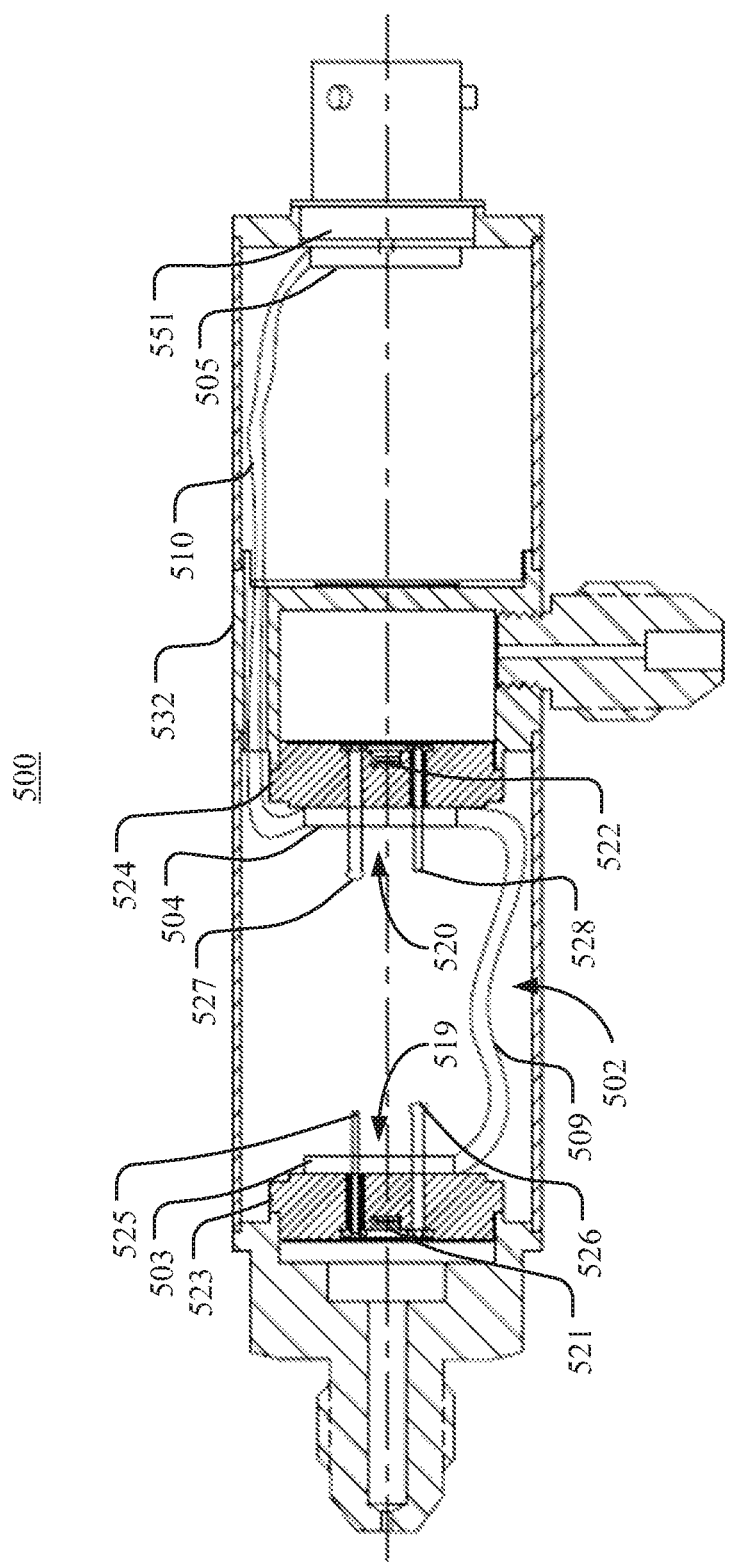
FIG. 5 illustrates a partial longitudinal cross-sectional view of one embodiment of a sensor assembly having a flexible interconnect structure in accordance with various aspects set forth herein.

In another example of a sensor assembly configuration, FIG. 5 illustrates a partial longitudinal cross-sectional view of one embodiment of a sensor assembly 500 having a flexible interconnect structure 502 in accordance with various aspects set forth herein. In FIG. 5, the sensor assembly 500 may be configured to include a first sensor structure 519, a second sensor structure 520, a housing 532, a connector 551 and the flexible interconnect structure 502. The first sensor structure 519 may be configured to include a first sensor element 521, a first header 523 and a first and second header pins 525 and 526. Similarly, the second sensor structure 520 may be configured to include a second sensor element 522, a second header 524 and a second and third header pins 527 and 528. Each of the first and second sensor elements 521 and 522 may be configured collectively or individually as a pressure sensor. In another example, the first sensor element 521 may form a first half of a Wheatstone bridge and the second sensor element 522 may form a second half of the Wheatstone bridge. Each of the first and second headers 523 and 524 may include a header shell that defines a sensor cavity. Further, the sensor cavities of each of the first and second headers 523 and 24 may house the first and second sensor elements 521 and 522, respectively. The first and second header pins 525 and 526 may be electrically coupled to the first sensor element 521. Further, the third and fourth header pins 527 and 528 may be electrically coupled to the second sensor element 522.

In FIG. 5, the flexible interconnect structure 502 may be configured to include first, second and third rigid sections 503, 504 and 505 and a first and second flexible sections 509 and 510, respectively. Each of the first and second flexible sections 509 and 510 may have a frontend and a backend. The frontend of the first flexible section 509 may be coupled to the first rigid section 503 and the backend of the first flexible section 509 may be coupled to the second rigid section 504. Similarly, the frontend of the second flexible section 510 may be coupled to the second rigid section 504 and the backend of the second flexible section 510 may be coupled to the third rigid section 505. The flexible interconnect structure 502 may bend around the inside of the sensor assembly 501 such that the first rigid section 503 is directly behind the first header 523 of the first sensor structure 519. Similarly, the flexible interconnect structure 502 may bend around the inside of the sensor assembly 501 such that the second rigid section 504 is directly behind the second header 524 of the second sensor structure 520.

In this embodiment, the first rigid section 503 may be configured to include one or more connection points. The one or more connection points of the first rigid section 503 may be used to couple the first rigid section 503 to the first sensor structure 519. The first rigid section 503 may be pressed onto the back of the first header 523 such that the first and second header pins 525 and 526 pass through the two connection points of the first rigid section 503 to couple to the first sensor structure 519. The second rigid section 504 may be configured to include one or more connection points. The second rigid section 504 may be pressed onto the back of the second header 524 such that the third and fourth header pins 527 and 528 pass through the two connection points of the second rigid section 504 to couple to the second sensor structure 520. The third and fourth connection points 517 and 518 may be used to couple the second rigid section 504 to the second sensor structure 520. The third rigid section 505 may be configured to include one or more connection points. The one or more connection points of the third rigid section 505 may be used to couple the third rigid section 505 to the connector 551, which may be used to couple the sensor assembly 500 to an external component such as a circuit board used to control or acquire measurements from the sensor assembly 500.

In FIG. 5, each of the flexible sections 509 and 510 may include one or more traces. The one or more traces may be used to couple two or more connection points. For example, a trace of the first flexible section 509 may couple a connection point of the first rigid section 503 to a connection point of the second rigid section 504. In another example, a trace of the second flexible section 510 may couple a connection point of the second rigid section 504 to a connection point of the third rigid section 505. In another example, a trace of the first flexible section 509 and a trace of the second flexible section 130 may couple a connection point of the first rigid section 503 to a connection point of the third rigid section 505. In another example, a trace of the second flexible section 130 may couple a connection point of the second rigid section 504 to a connection point of the third rigid section 505. Each of the traces may be a metal such as copper.

It is important to recognize that it is impractical to describe every conceivable combination of components or methodologies for purposes of describing the claimed subject matter. However, a person having ordinary skill in the art will recognize that many further combinations and permutations of the subject technology are possible. Accordingly, the claimed subject matter is intended to cover all such alterations, modifications and variations that are within the spirit and scope of the claimed subject matter.

Although the present disclosure describes specific examples, embodiments, and the like, various modifications and changes may be made without departing from the scope of the present disclosure as set forth in the claims below. For example, although the example methods, devices and systems, described herein are in conjunction with a configuration for the aforementioned flexible interconnect structure for a sensor assembly, the skilled artisan will readily recognize that the example methods, devices or systems may be used in other methods, devices or systems and may be configured to correspond to such other example methods, devices or systems as needed. Further, while at least one example, embodiment, or the like has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims. Any benefits, advantages, or solutions to problems that are described herein with regard to specific examples, embodiments, or the like are not intended to be construed as a critical, required, or essential feature or element of any or all of the claims.

We claim:

1. A method, comprising:
    configuring a first sensor structure configured to measure a first pressure;
    configuring a second sensor structure configured to measure a second pressure;
    configuring a main connector to interface with an external component;
    assembling a flexible interconnect structure, the assembling comprising:
        electrically coupling a first rigid section with the first sensor structure;
        electrically coupling a first flexible section with the first rigid section, the first flexible section having a frontend;
        electrically coupling a second rigid section with the second sensor structure, the second rigid section having a frontend in electrical communication with a backend of the first flexible section;
        electrically coupling a frontend of a second flexible section with a backend of the second rigid section;
        electrically coupling a third rigid section with the main connector, the third rigid section having a frontend in electrical communication with a backend of the second flexible section, wherein the third rigid section is configured to receive signals from the first sensor structure and the second sensor structure;
    installing, in a housing, the flexible interconnect structure; and
    connecting the flexible interconnect structure to the first sensor structure, the second sensor structure, and the main connector;
    wherein each of the first rigid section, the second rigid section, and the third rigid section is an independently rigid printed circuit board (PCB) integrated with the flexible interconnect structure and wherein each of the first sensor structure and the second sensor structure comprises: a header; a sensor element; and one or more header pins coupled to the header and electrically coupled to the sensor element.

2. The method of claim 1, further comprising configuring the first flexible section and the second flexible section to bend within a cavity formed by the housing.

3. The method of claim 1, further comprising mounting the first rigid section and the second rigid section to the respective header for electrical communication with the respective sensor element.

4. The method of claim 1, further comprising measuring an applied pressure with one or more of the first sensor structure and the second sensor structure.

5. The method of claim 1, further comprising measuring a difference in pressure between the first sensor structure and the second sensor structure.

6. The method of claim 1, wherein one or more of the first sensor structure and the second sensor structure are configured as redundant pressure sensors.

7. The method of claim 1, wherein the first sensor structure forms a first half of a Wheatstone bridge and the second sensor structure forms a second half of the Wheatstone bridge.

8. The method of claim 1, wherein the first sensor structure includes a first conductor and a second conductor, wherein the first conductor is coupled to a first connection point and the second conductor is coupled to a second connection point;
    wherein the second sensor structure includes a third conductor and a fourth conductor, wherein the third conductor is coupled to a third connection point and the fourth conductor is coupled to a fourth connection point; and
    wherein the main connector includes a fifth conductor, a sixth conductor and a seventh conductor, wherein the fifth conductor is coupled to a fifth connection point, the sixth conductor is coupled to a sixth connection point, and the seventh conductor is coupled to a seventh connection point.

9. The method of claim 1, wherein each of the first, second, third, fourth, fifth, sixth and seventh connection points comprise one or more of through hole and plated connection points.

* * * * *